US012306047B2

(12) United States Patent
Hickey et al.

(10) Patent No.: US 12,306,047 B2
(45) Date of Patent: May 20, 2025

(54) SYSTEM AND METHOD FOR MONITORING A MULTI-CELL RECHARGEABLE ENERGY STORAGE DEVICE

(71) Applicant: GM GLOBAL TECHNOLOGY OPERATIONS LLC, Detroit, MI (US)

(72) Inventors: Ryan P. Hickey, Austin, TX (US);
Kristopher A. Thor, Novi, MI (US);
David R. Clark, Grosse Pointe Woods, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 616 days.

(21) Appl. No.: 17/697,029

(22) Filed: Mar. 17, 2022

(65) Prior Publication Data

US 2023/0296448 A1    Sep. 21, 2023

(51) Int. Cl.
| | |
|---|---|
| G01K 11/00 | (2006.01) |
| B60L 58/10 | (2019.01) |
| G01K 3/00 | (2006.01) |
| G01K 11/22 | (2006.01) |
| G01R 27/16 | (2006.01) |

(52) U.S. Cl.
CPC .............. *G01K 11/22* (2013.01); *B60L 58/10* (2019.02); *G01K 3/005* (2013.01); *G01R 27/16* (2013.01)

(58) Field of Classification Search
CPC ........ G01K 11/22; G01K 3/005; G01R 27/16; B60L 58/10
USPC ...................................................... 374/5, 159
See application file for complete search history.

(56) References Cited

U.S. PATENT DOCUMENTS

| | | | | |
|---|---|---|---|---|
| 5,786,682 A | * | 7/1998 | Aiken ................... | H02J 7/0068 320/136 |
| 2016/0079637 A1 | * | 3/2016 | Nemesh ............ | H01M 10/6569 429/62 |
| 2022/0393262 A1 | * | 12/2022 | Rosenberger ..... | H01M 10/6556 |
| 2024/0271878 A1 | * | 8/2024 | Catalano ............. | F28D 20/0056 |

FOREIGN PATENT DOCUMENTS

| | | | | | |
|---|---|---|---|---|---|
| CN | 102299267 A | * | 12/2011 | .......... | H01M 10/482 |
| CN | 105684187 A | * | 6/2016 | .......... | H01M 10/482 |
| CN | 105830275 A | * | 8/2016 | .......... | B60L 11/1874 |
| CN | 206878536 U | * | 1/2018 | | |

(Continued)

OTHER PUBLICATIONS

U.S. Appl. No. 17/697,029, filed Oct. 31, 2024_CN_105684187_A_H.pdf, Jun. 15, 2016.*

(Continued)

*Primary Examiner* — Gail Kaplan Verbitsky
(74) *Attorney, Agent, or Firm* — Quinn IP Law

(57) ABSTRACT

A monitoring system for a multi-cell rechargeable energy storage system (RESS) that includes a plurality of battery cells is described. The monitoring system includes a sensor that is arranged to monitor one or multiple heat transfer plates thermally coupled to the plurality of battery cells, a controller is in communication with the sensor. The controller including an instruction set that is executable to monitor, via the sensor, a parameter of the heat transfer plate and detect a thermal runaway event when the parameter of the heat transfer plate exceeds a threshold. The thermal runaway event is communicated to a battery controller.

20 Claims, 4 Drawing Sheets

(56) References Cited

FOREIGN PATENT DOCUMENTS

| CN | 207995610 U | * | 10/2018 | |
|---|---|---|---|---|
| CN | 109786872 A | * | 5/2019 | |
| CN | 213026382 U | * | 4/2021 | |
| JP | H07128179 A | * | 5/1995 | .......... H01M 10/486 |
| JP | 2003100272 A | * | 4/2003 | |
| JP | 2003235268 A | * | 8/2003 | |
| JP | 2004022496 A | * | 1/2004 | |
| JP | 2008173241 A | * | 7/2008 | |
| JP | 2008192393 A | * | 8/2008 | |
| JP | 2008206685 A | * | 9/2008 | |
| WO | WO-2020198257 A1 | * | 10/2020 | ........... A61B 8/4455 |
| WO | WO-2022020255 A1 | * | 1/2022 | ........ H01M 10/0525 |

OTHER PUBLICATIONS

7697029_Oct. 31, 2024_JP_2003235268_A_H.pdf,Aug. 22, 2003.*
U.S. Appl. No. 17697,029, filed Oct. 31, 2024_JP_2008173241_A_H.pdf,Jul. 31, 2008.*
U.S. Appl. No. 17/697,029, filed Oct. 31, 2024_JP_2008192393_A_H.pdf,Aug. 21, 2008.*
U.S. Appl. No. 17/697,029, filed Oct. 31, 2024_JP_2008206685_A_H.pdf,Sep. 11, 2008.*
U.S. Appl. No. 17/697,029, filed Nov. 4, 2024_JP_2003100272_A_H.pdf,Apr. 4, 2003.*
U.S. Appl. No. 17/697,029, filed Nov. 5, 2024_JP_H07128179_A_H.pdf, May 19, 1995.*
U.S. Appl. No. 17/697,029, filed Nov. 4, 2024_JP_2004022496_A_H.pdf,Jan. 22, 2004.*
U.S. Appl. No. 17/697,029, filed Nov. 4, 2024_WO_2020198257_A1_H.pdf,Oct. 1, 2020.*
U.S. Appl. No. 17/697,029_CN_206878536_U_H.pdf,Nov. 5, 2024.*
U.S. Appl. No. 17/697,029, filed Nov. 4, 2024_CN_213026382_U_H.pdf,Apr. 20, 2021.*
U.S. Appl. No. 17/697,029, filed Nov. 5, 2024_WO_2022020255_A1_H.pdf,Jan. 27, 2022.*
U.S. Appl. No. 17/697,029, filed Feb. 20, 2025_CN_105830275_A_H.pdf,Aug. 3, 2016.*
U.S. Appl. No. 17/697,029, filed Feb. 20, 2025_CN_109786872_A_H.pdf,May 21, 2019.*

* cited by examiner

SYSTEM AND METHOD FOR MONITORING A MULTI-CELL RECHARGEABLE ENERGY STORAGE DEVICE

INTRODUCTION

A rechargeable energy storage system (RESS) can be employed in a stationary energy storage system or in a mobile device, e.g., as part of an electric vehicle (EV). When employed as part of an EV, an electrified powertrain employs one or multiple electric machines to generate torque employing energy derived at least in part from an RESS, with the generated torque being delivered to a drivetrain for tractive effort.

The RESS, which can include a multi-cell battery pack, associated power electronics, and thermal regulation hardware, may be controlled via a resident battery controller. The battery controller may be used to monitor the ongoing health of hardware and software components of the RESS, as well as to control electrical charging and discharging operations. Other functions may include monitoring and reporting of battery pack voltage, individual cell voltages and cell currents, states of charge, and temperatures. The battery controller may also perform periodic cell balancing operations to equalize the states of charge of the various battery cells.

A battery pack may experience an undesirable battery thermal condition due to overcharging, battery cell damage, cell charging/discharging imbalances, etc. Thermal runaway may be initiated by a short circuit within a cell, overcharging or over-discharging, physical damage, exposure of the cell to extreme external temperatures, or other causes. A thermal runaway event may occur when a rate of heat generation within a battery pack exceeds a rate at which the generated heat can be effectively dissipated by onboard thermal regulation devices, system and techniques and/or power control actions.

There is a need for methods, apparatuses, and systems for detecting conditions that may lead to excessive temperatures in an RESS, including detecting conditions related to a thermal runaway event to enable timely mitigation efforts.

SUMMARY

The concepts described herein provide a monitoring system for a multi-cell rechargeable energy storage system (RESS) that includes a plurality of battery cells. The monitoring system includes a sensor that is arranged to monitor one or multiple heat transfer plates thermally coupled to the plurality of battery cells, a controller is in communication with the sensor. The controller including an instruction set that is executable to monitor, via the sensor, a parameter of the heat transfer plate and detect a thermal runaway event when the parameter of the heat transfer plate exceeds a threshold. The thermal runaway event is communicated to a battery controller.

An aspect of the disclosure includes the sensor arranged to monitor the heat transfer plate being an ultrasonic sensor that is arranged to monitor a wave attenuation in the heat transfer plate, wherein the wave attenuation correlates to a temperature in the heat transfer plate.

Another aspect of the disclosure includes the instruction set being executable to detect a thermal runaway event when the wave attenuation exceeds a threshold wave attenuation.

Another aspect of the disclosure includes a fluidic heat transfer system that is thermally coupled to the heat transfer plate, with the sensor arranged to monitor the heat transfer plate being a temperature sensor arranged to monitor a temperature in the fluidic heat transfer system.

Another aspect of the disclosure includes the instruction set being executable to detect a thermal runaway event when the temperature in the fluidic heat transfer system exceeds a threshold temperature.

Another aspect of the disclosure includes a fluidic heat transfer system that is thermally coupled to the heat transfer plate, with the sensor arranged to monitor the heat transfer plate being a first temperature sensor and a second temperature sensor that are arranged to monitor a temperature differential in the fluidic heat transfer system.

Another aspect of the disclosure includes the instruction set being executable to detect a thermal runaway event when the temperature differential in the fluidic heat transfer system exceeds a threshold temperature differential.

Another aspect of the disclosure includes the sensor arranged to monitor the heat transfer plate being a thin wire circuit disposed onto the heat transfer plate and a controller is arranged to monitor the thin wire circuit.

Another aspect of the disclosure includes the instruction set being executable to detect a thermal runaway event when the controller detects an impedance of the thin wire circuit that exceeds a threshold impedance.

Another aspect of the disclosure includes the instruction set being executable to detect a thermal runaway event when the controller detects an open circuit in the thin wire circuit.

Another aspect of the disclosure includes the heat transfer plate being a sheet that is interposed between adjacent battery cells and in thermal contact with external side portions of the battery cells.

Another aspect of the disclosure includes the heat transfer plate being a sheet that is interposed between adjacent ones of the battery cells and in thermal contact with outer side surfaces thereof.

Another aspect of the disclosure includes the heat transfer plate being a sheet that is interposed between adjacent battery cells and in thermal contact with outer bottom surfaces thereof.

Another aspect of the disclosure includes a monitoring system for a rechargeable energy storage system (RESS) having a plurality of electrochemical battery cells that includes a plurality of heat transfer plates that are thermally coupled to the plurality of electrochemical battery cells, and at least one sensor arranged to monitor the plurality of heat transfer plates. A controller is in communication with the at least one sensor. The controller includes an instruction set that is executable to monitor, via the at least one sensor, a parameter of the plurality of heat transfer plates and detect a thermal runaway event when the parameter of the heat transfer plate exceeds a threshold. The thermal runaway event is communicated to another controller.

Another aspect of the disclosure includes a method for monitoring a rechargeable energy storage system (RESS) including a plurality of electrochemical battery cells. The method includes monitoring, via a sensor, a parameter for a plurality of heat transfer plates thermally coupled to the plurality of electrochemical battery cells to monitor, via the at least one sensor, a parameter of the heat transfer plate to detect a thermal runaway event, which may occur when the parameter of the heat transfer plate exceeds a threshold.

Another aspect of the disclosure includes the plurality of heat transfer plates interposed between electrochemical battery cells and in thermal contact with external side portions of the electrochemical battery cells being fabricated from one of copper, aluminum, steel, or alloys thereof.

The above summary is not intended to represent every possible embodiment or every aspect of the present disclosure. Rather, the foregoing summary is intended to exemplify some of the novel aspects and features disclosed herein. The above features and advantages, and other features and advantages of the present disclosure, will be readily apparent from the following detailed description of representative embodiments and modes for carrying out the present disclosure when taken in connection with the accompanying drawings and the claims.

BRIEF DESCRIPTION OF THE DRAWINGS

One or more embodiments will now be described, by way of example, with reference to the accompanying drawings, in which.

Figure 1:
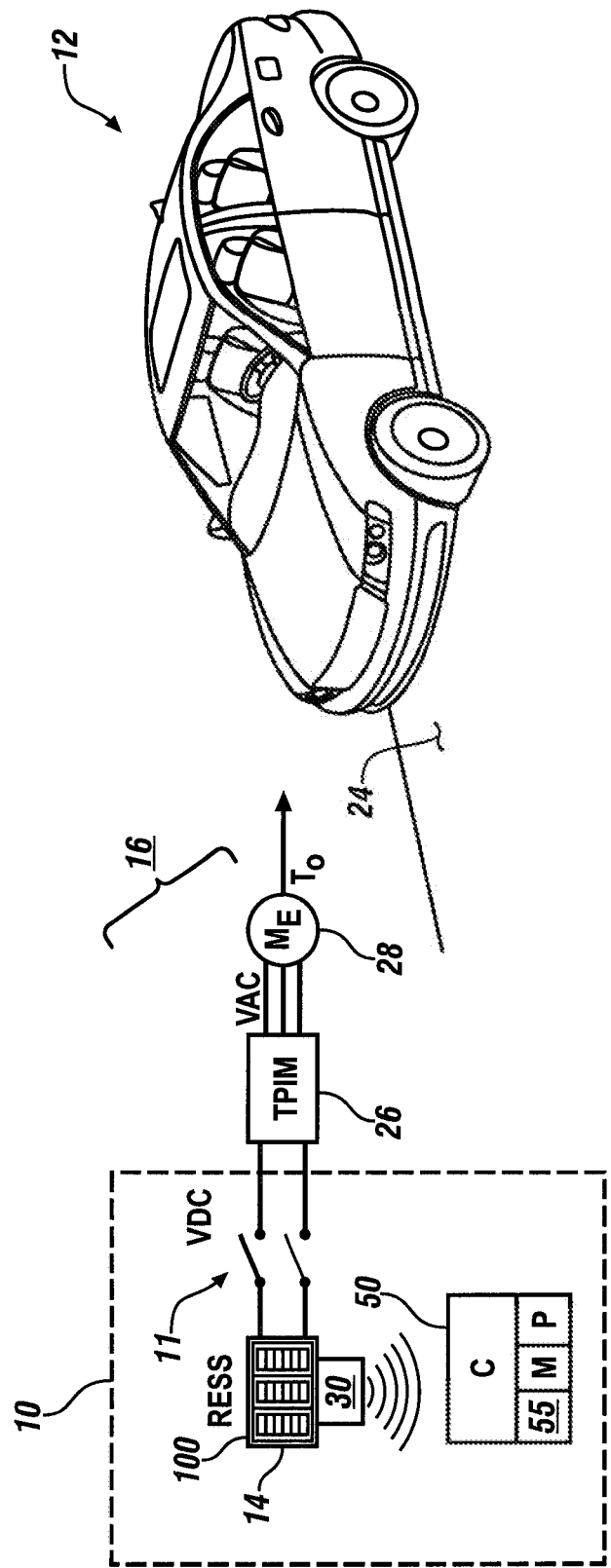
FIG. 1 schematically illustrates a vehicle including a rechargeable energy storage system (RESS), in accordance with the disclosure.

The present disclosure is susceptible to various modifications and alternative forms, and some representative embodiments have been shown by way of example in the drawings and will be described in detail herein. Novel aspects of this disclosure are not limited to the particular forms illustrated in the drawings. Rather, the disclosure is intended to cover modifications, equivalents, combinations, or alternatives falling within the spirit and scope of the disclosure as defined by the appended claims.

DETAILED DESCRIPTION

The following detailed description is merely exemplary in nature and is not intended to limit the application and uses. Embodiments of the present disclosure are described herein in terms of functional and/or logical block components and various processing steps. Such block components may be realized by a number of different hardware components each configured to perform the specified functions. In addition, those skilled in the art will appreciate that embodiments of the present disclosure may be practiced to advantage in conjunction with a number of systems, and that the systems described herein are merely exemplary embodiments of the present disclosure.

Referring to the drawings, wherein like reference numerals are used to identify like or identical components in the various views, FIG. 1 schematically depicts a battery system 10 having a multi-cell rechargeable energy storage system (RESS) 100. In one embodiment, and as shown, the battery system 10 and RESS 100 are arranged to supply electric power to an electrified powertrain 16 on a vehicle 12.

The battery system 10 described herein includes RESS 100 that couples to the electrified powertrain 16 via a high-voltage bus 11, a battery controller 50, and a TRE (Thermal Runaway Event) sensing system 30. The battery controller 50 is depicted schematically in FIG. 1 as a unitary device solely for illustrative simplicity and descriptive clarity. The TRE sensing system 30 may be a stand-alone arrangement in one embodiment. Alternatively, portions of the TRE sensing system 30 may be integrated into the battery controller 50.

The battery controller 50 includes a memory (M) having an instruction set 55 and a processor (P), and may include several memory and/or processor devices, locations, and hardware configurations within the scope of the disclosure. Collectively, the various controllers making up the battery controller 50 are programmed to monitor and regulate ongoing thermal and electrical operations of the battery system 10. The constituent controllers of the battery controller 50 may selectively execute other software programs, including, e.g., cell balancing, health monitoring, electric range estimation, and/or powertrain control operations, with such applications being understood in the art and therefore not described herein.

The battery controller 50 communicates with a vehicle operator via audio devices, visual devices, haptic devices, etc., to provide notification of detection of a thermal runaway event. The battery controller 50 may communicate off-vehicle using telematics devices, V2X communications, and other communication mechanisms to provide notification of detection of a thermal runaway event.

The instruction set 55 monitors inputs from various sensors and executes software instructions to monitor the ongoing health of hardware and software components of the RESS 100, as well as to control electrical charging and discharging operations. Other functions executed by the instruction set 55 may include monitoring and reporting of battery pack voltage, individual cell voltages and cell currents, states of charge, and temperatures. Furthermore, the instruction set 55 may perform periodic cell balancing operations to equalize the states of charge of the various battery cells. Furthermore, portions of the TRE sensing system 30 may be integrated into the battery controller 50 in conjunction with the elements described with reference to FIGS. 2 and 3.

The battery controller 50 receives input signals and transmits output signals to change or maintain a present operating state of the battery system 10. The battery controller 50 is embodied as multiple controllers as noted above, i.e., electronic control units and/or application-specific integrated circuits (ASICs) each having or being able to access the requisite memory (M) and processor (P), as well as other associated hardware and software, e.g., a clock or timer, input/output circuitry, etc.

The vehicle 12 with battery system 10 may be employed in a range of applications or systems, including but not limited to road, air, water, or rail vehicles, agricultural equipment, robots, stationary or mobile powerplants, and other mobile or stationary systems. A possible application of the present battery system 10, and in particular the RESS 100 thereof, is a high-energy direct current (DC) power supply for use in the electrified powertrain 16. Such an electrified powertrain 16 may be used in some embodiments to propel a motor vehicle 12, e.g., an operator-driven or autonomously-driven passenger or commercial road vehicle. To do so, the electrified powertrain 16 may be controlled to generate and deliver output torque to front and/or rear road wheels to propel the motor vehicle 12 along a road surface 24.

The RESS 100 may be employed as a high-energy/high-voltage power supply aboard the motor vehicle 12. In such an embodiment, the RESS 100 may be selectively disconnected via a set of high-voltage contactors 11 and configured to electrically energize a traction power inverter module (TPIM) 26. The TPIM 26 may contain multiple sets of semiconductor switches and filtering components arranged in phase-specific switching legs, with ON/OFF states of the individual IGBT, MOFSET, or other semiconductor switches changed at a particular rate, e.g., using pulsewidth modulation. Switching control thus enables the TPIM 26 to receive a DC voltage (VDC) from the RESS 100 and to output a polyphase/AC voltage (VAC). Phase windings of a rotary electric machine (ME) 28 may be electrically connected to the TPIM 26, as noted above, such that the output torque from the electric machine 28 is ultimately delivered to a coupled load, e.g., road wheels.

Figure 2:
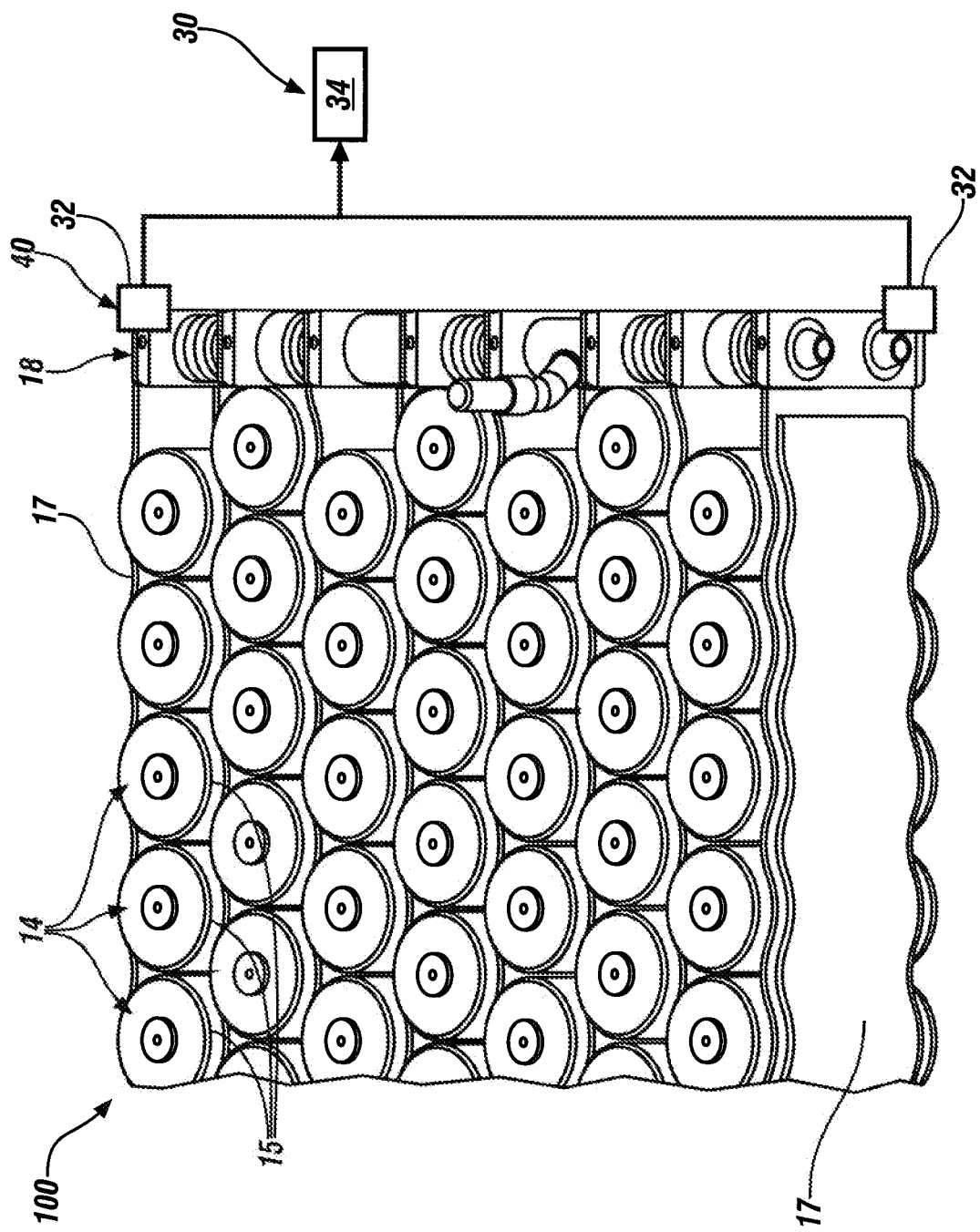
FIG. 2 schematically illustrates a portion of an embodiment of an RESS including an embodiment of a thermal runaway event (TRE) sensing system, in accordance with the disclosure.

FIG. 2 schematically illustrates details of a portion of an embodiment of the RESS 100 and TRE sensing system 30 of FIG. 1. The RESS 100 includes a plurality of battery cells 14, heat transfer plates 17, and an end portion 18 that is integrated into a heat transfer system 40. In one embodiment, and as shown, the plurality of battery cells 14 are configured as cylindrical elements having outer vertical surfaces 15, and are arranged in multiple rows in close proximity to one another, with electrical connections (not shown) therebetween. In such embodiments, the heat transfer plates 17 are configured as elongated sheets that are fabricated from material capable of heat transfer, such as copper, aluminum, steel, alloys thereof, or another material. In such embodiments, the heat transfer plates 17 are placed between the rows of the battery cells 14 and are thermally coupled to at least a portion of the outer vertical surfaces 15 for conductive heat transfer. One end of each of the heat transfer plates 17 is mechanically and thermally coupled to the end portion 18 for heat transfer purposes.

Alternatively, the plurality of battery cells 14 are configured as prismatic elements having outer vertical surfaces and bottom surfaces, and are arranged in a row with electrical connections therebetween. In such embodiments, the heat transfer plates may include a flat horizontal plate and, in one embodiment, a plurality of vertical sheets. The heat transfer plates are fabricated from material capable of heat transfer, such as copper, aluminum, steel, alloys thereof, or another material. In such embodiments, the battery cells 14 rest on the horizontal heat transfer plate, with the vertical heat transfer plates being interposed between the battery cells 14 and are thermally coupled to at least a portion of the outer vertical surfaces for conductive heat transfer. One end of the horizontal heat transfer plate is mechanically and thermally couple to the end portion 18 for heat transfer purposes.

Referring again to FIG. 2, one or multiple sensor(s) 32 is arranged to monitor parameter(s) that correspond(s) to thermal energy in the heat transfer plate(s) 17. The sensor(s) 32 is in communication with a controller 34, which executes signal processing and calibration routines to determine one or multiple parameters corresponding to thermal energy and/or temperature of the heat transfer plate 17. The controller 34 communicates the parameters corresponding to thermal energy and/or temperature of the heat transfer plate 17 to a second controller, e.g., the battery controller 50, for further actions in keeping therewith.

In one embodiment, the end portion 18 is integrated into the heat transfer system 40. The heat transfer system 40 is composed of fluidic plumbing, fluidic pump, heat transfer liquid, fluid/air radiator, and other elements that are arranged to transfer heat away from the end portion 18 and thus transfer heat away from the heat transfer plate(s) 17 that is thermally coupled thereto.

In one embodiment, the sensor 32 includes a single temperature sensor, e.g., a thermistor or a thermocouple, that monitors a temperature in the heat transfer system 40. The temperature in the heat transfer system 40 can be employed to detect occurrence of a thermal runaway event in the RESS 100, which may be caused by a fault in the RESS 100 due to a short circuit within one of the cells 14, overcharging or over-discharging, physical damage, exposure of one of the cells 14 to extreme external temperatures, or other causes.

In one embodiment, multiple temperature sensors 32 in the form of thermistors or thermocouples are arranged to monitor an input temperature and an output temperature in the heat transfer system 40, and thus monitor a temperature differential in the heat transfer system 40. The temperature differential in the heat transfer system 40 can be correlated to heat transfer therein, which can be employed to detect occurrence of a thermal runaway event.

In one embodiment, the sensor(s) 32 includes one or multiple ultrasonic sensors that monitor wave attenuation in the heat transfer plate(s) 17, which can be employed to detect occurrence of a thermal runaway event. Wave attenuation correlates to temperature and thus cumulative heat that is present in the heat transfer plate 17, and is indicative of thermal energy in the heat transfer plates 17. Occurrence of a thermal runaway event may be detected when the wave attenuation detected by the sensor(s) 32 in the heat transfer plate(s) 17 exceeds a threshold temperature. Occurrence of a thermal runaway event is communicated to the battery controller 50, which can initiate one or multiple battery control actions to mitigate the thermal runaway event and notify other systems and/or a vehicle operator of the occurrence thereof.

Figure 3:
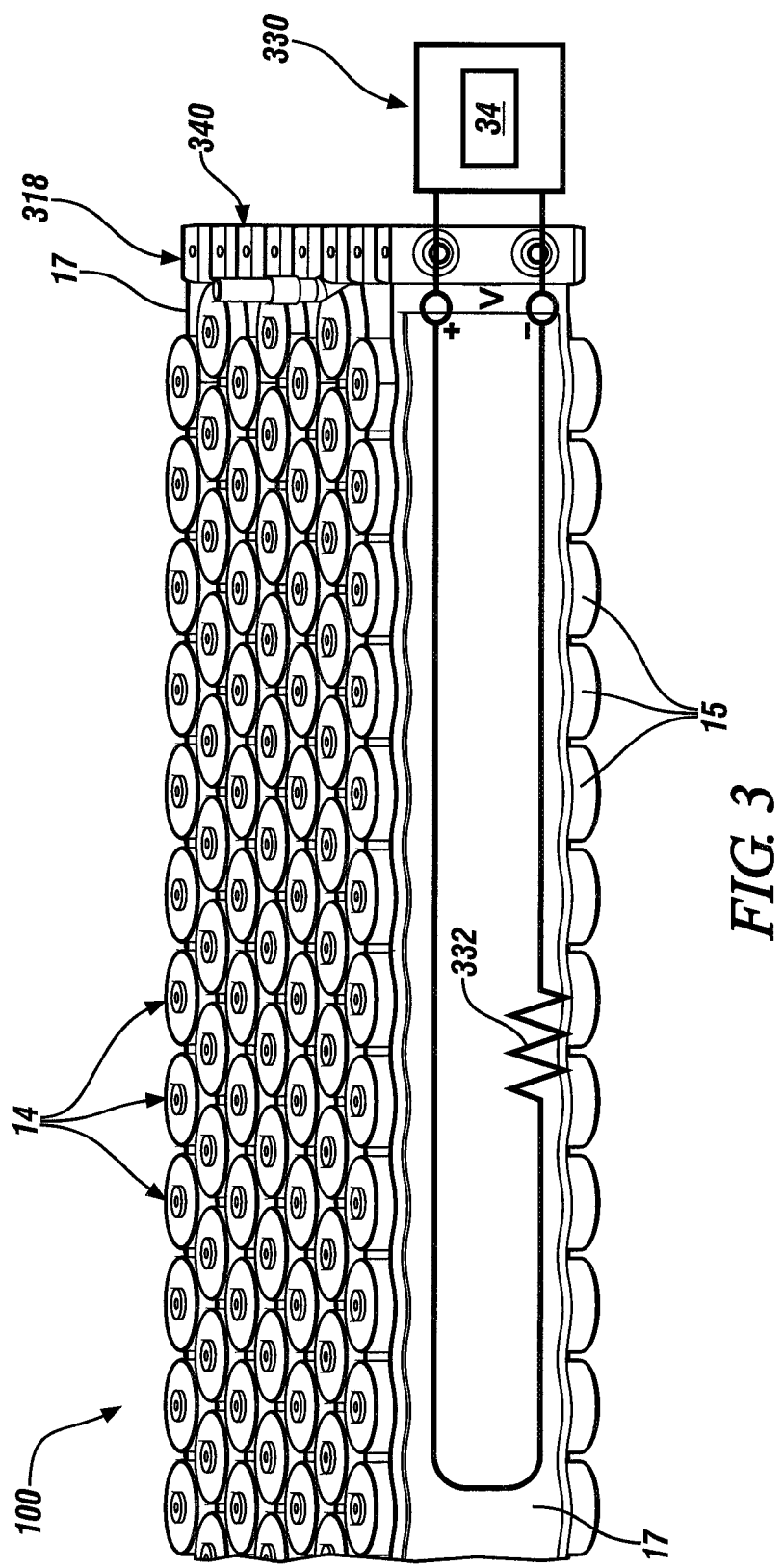
FIG. 3 schematically illustrates a portion of an embodiment of an RESS including another embodiment of a TRE sensing system, in accordance with the disclosure.

FIG. 3 schematically illustrates details of a portion of another embodiment of the RESS 100 of FIG. 1, including a plurality of battery cells 14, heat transfer plate(s) 17, end portion 318, TRE sensing system 330, and heat transfer system 340.

In one embodiment, the TRE sensing system 330 includes a sensor in the form of a thin wire circuit 332 that is arranged to monitor parameter(s) that correspond(s) to thermal energy in the heat transfer plate(s) 17, and controller 34. The thin wire circuit 332 is in communication with the controller 34, which executes signal processing and calibration routines to determine one or multiple parameters corresponding to thermal energy and/or temperature of the heat transfer plate 17. The controller 34 communicates the parameters corresponding to thermal energy and/or temperature of the heat transfer plate 17 to a second controller, e.g., the battery controller 50, for further actions in keeping therewith.

In one embodiment, the thin wire circuit 332 that is arranged to monitor the heat transfer plate 17 is screen-printed, glued, etched or otherwise secured onto the heat transfer plate 17, and the controller 34 that is arranged to monitor the thin wire circuit 332. In one embodiment, the thin wire circuit 332 is arranged as a resistive temperature sensor. The controller 34 is configured to measure an impedance of the thin wire circuit 332, determine a temperature thereof employing a calibration, and report the temperature of the heat transfer plate 17. The temperature of the heat transfer plate 17 can indicate a likelihood of occurrence of a thermal runaway event when a threshold temperature is exceeded. The threshold temperature is correlated to a temperature level, and thus heat in the heat transfer plate 17 indicates an onset of a thermal runaway event in the RESS 100.

Alternatively, the thin wire circuit 332 is screen-printed, glued, etched or otherwise secured onto the heat transfer plate 17, with the controller 34 configured to measure electrical continuity therein. The thin wire circuit 332 can be fabricated from a metal alloy having a thermal melting temperature that corresponds to a temperature corresponding to a likelihood of occurrence of a thermal runaway event. The controller 34 can monitor impedance of the thin wire circuit 332 and report occurrence a high impedance event, i.e., an open circuit, which can indicate a likelihood of occurrence of a thermal runaway event. The occurrence of an open circuit can be caused by a melting and dissolution of the thin wire circuit 332 caused by high temperature in one embodiment. Stated differently, the controller 34 can detect a temperature-induced fracture of the thin wire circuit 332 or a temperature-induced melting of the thin wire circuit 332.

Alternatively, the thin wire circuit 332 is screen-printed, etched or otherwise secured onto the heat transfer plate 17, with the controller 34 configured to measure electrical continuity therein. The thin wire circuit 332 can be fabricated from a metal alloy, a semiconductor ceramic element, or another conductive material. The controller 34 can monitor impedance of the thin wire circuit 332 and detect and report occurrence a high impedance event, i.e., an open circuit, which can indicate a likelihood of occurrence of a thermal runaway event. The occurrence of an open circuit can be caused by thermal expansion of the heat transfer plate 17, which causes the thin wire circuit 332 to fracture, and thus lead to an open circuit. Alternatively, the open circuit may be created when the thin wire circuit 332 is melted by exposure to an elevated temperature, thus breaking the electrical circuit.

Figure 4:
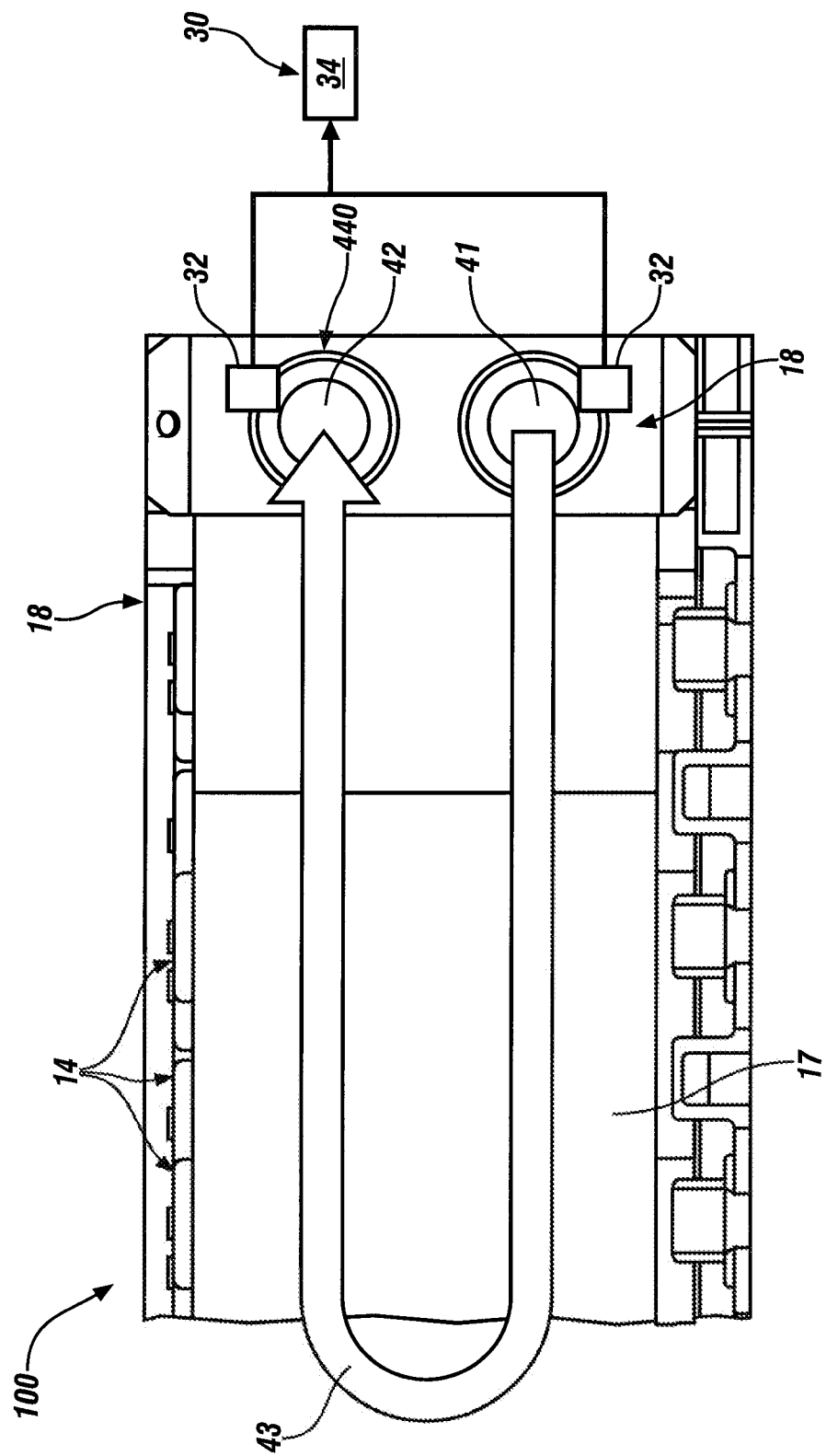
FIG. 4 schematically illustrates a portion of an embodiment of an RESS including another embodiment of a TRE sensing system, in accordance with the disclosure.

FIG. 4 schematically illustrates details of a portion of an embodiment of the RESS 100 and TRE sensing system 30 of FIG. 1, including one of the heat transfer plates 17 of the RESS 100 and an end portion 18 that is integrated into a heat transfer system 440. In one embodiment, and as shown, the plurality of battery cells 14 are configured as cylindrical elements having outer vertical surfaces, and arranged in multiple rows in close proximity to one another, with electrical connections (not shown) therebetween. In such embodiments, the heat transfer plate 17 is configured as elongated sheets that are fabricated from material capable of heat transfer, such as copper, aluminum, steel, alloys thereof, or another material. In such embodiments, the heat transfer plate 17 is placed between the rows of the battery cells 14 and are thermally coupled to at least a portion of the outer vertical surfaces 15 for conductive heat transfer. One end of each of the heat transfer plates 17 is mechanically and thermally coupled to the end portion 18 for heat transfer purposes. The heat transfer plate 17 also includes, in this embodiment, a conduit 43 through which coolant flows between an inlet 41 and an outlet 42 to effect heat transfer. The TRE sensing system 30 includes one or multiple sensor(s) 32 is arranged to monitor parameter(s) that correspond(s) to thermal energy in the heat transfer plate(s) 17, specifically heat of the coolant that is flowing in the conduit 43 between the inlet 41 and the outlet 42. The coolant may be air, water, ethylene glycol, or another heat transfer medium. The sensor(s) 32 is in communication with controller 34, which executes signal processing and calibration routines to determine one or multiple parameters corresponding to thermal energy and/or temperature of the heat transfer plate 17. The controller 34 communicates the parameters corresponding to thermal energy and/or temperature of the heat transfer plate 17 to a second controller, e.g., the battery controller 50, for further actions in keeping therewith.

In one embodiment, the inlet 41 and outlet 42 are integrated into the heat transfer system 440. The heat transfer system 440 is composed of fluidic plumbing, fluidic pump, heat transfer liquid, fluid/air radiator, and other elements that are arranged to transfer heat away from the end portion 18 and thus transfer heat away from the heat transfer plate(s) 17 that is thermally coupled thereto.

In one embodiment, the sensor 32 includes a single temperature sensor, e.g., a thermistor or a thermocouple, that monitors a temperature in the heat transfer system 440. The temperature in the heat transfer system 440 can be employed to detect occurrence of a thermal runaway event in the RESS 100, which may be caused by a fault in the RESS 100 due to a short circuit within one of the cells 14, overcharging or over-discharging, physical damage, exposure of one of the cells 14 to extreme external temperatures, or other causes.

In one embodiment, multiple temperature sensors 32 in the form of thermistors or thermocouples are arranged to monitor an input temperature and an output temperature in the heat transfer system 440, and thus monitor a temperature differential in the heat transfer system 440. The temperature differential in the heat transfer system 440 can be correlated to heat transfer therein, which can be employed to detect occurrence of a thermal runaway event.

In one embodiment, the sensor(s) 32 includes one or multiple ultrasonic sensors that monitor wave attenuation in the heat transfer plate(s) 17, which can be employed to detect occurrence of a thermal runaway event. Wave attenuation correlates to temperature and thus cumulative heat that is present in the heat transfer plate 17, and is indicative of thermal energy in the heat transfer plates 17. Occurrence of a thermal runaway event may be detected when the wave attenuation detected by the sensor(s) 32 in the heat transfer plate(s) 17 exceeds a threshold temperature. Occurrence of a thermal runaway event is communicated to the battery controller 50, which can initiate one or multiple battery control actions to mitigate the thermal runaway event and notify other systems and/or a vehicle operator of the occurrence thereof.

The TRE sensing system described herein advantageously facilitates detection of a thermal runaway event occurring within a battery module.

The term "controller" and related terms such as microcontroller, control, control unit, processor, etc. refer to one or various combinations of Application Specific Integrated Circuit(s) (ASIC), Field-Programmable Gate Array(s) (FPGA), electronic circuit(s), central processing unit(s), e.g., microprocessor(s) and associated non-transitory memory component(s) in the form of memory and storage devices (read only, programmable read only, random access, hard drive, etc.). The non-transitory memory component is capable of storing machine readable instructions in the form of one or more software or firmware programs or routines, combinational logic circuit(s), input/output circuit(s) and devices, signal conditioning, buffer circuitry and other components, which can accessed by and executed by one or more processors to provide a described functionality. Input/output circuit(s) and devices include analog/digital converters and related devices that monitor inputs from sensors, with such inputs monitored at a preset sampling frequency or in response to a triggering event. Software, firmware, programs, instructions, control routines, code, algorithms, and similar terms mean controller-executable instruction sets including calibrations and look-up tables. Each controller executes control routine(s) to provide desired functions. Routines may be executed at regular intervals, for example every 100 microseconds during ongoing operation. Alternatively, routines may be executed in response to occurrence of a triggering event. Communication between controllers, actuators and/or sensors may be accomplished using a direct wired point-to-point link, a networked communication bus link, a wireless link, or another communication link. Communication includes exchanging data signals, including, for example, electrical signals via a conductive medium; electromagnetic signals via air; optical signals via optical waveguides; etc. The data signals may include discrete, analog and/or digitized analog signals representing inputs from sensors, actuator commands, and communication between controllers.

The term "system" may refer to one of or a combination of mechanical and electrical actuators, sensors, controllers, application-specific integrated circuits (ASIC), combinatorial logic circuits, software, firmware, and/or other components that are arranged to provide the described functionality.

The term "signal" refers to a physically discernible indicator that conveys information, and may be a suitable waveform (e.g., electrical, optical, magnetic, mechanical or electromagnetic), such as DC, AC, sinusoidal-wave, triangular-wave, square-wave, vibration, and the like, that is capable of traveling through a medium.

The terms "calibration", "calibrated", and related terms refer to a result or a process that correlates a desired parameter and one or multiple perceived or observed parameters for a device or a system. A calibration as described herein may be reduced to a storable parametric table, a plurality of executable equations or another suitable form that may be employed as part of a measurement or control routine.

A parameter is defined as a measurable quantity that represents a physical property of a device or other element that is discernible using one or more sensors and/or a physical model. A parameter can have a discrete value, e.g., either "1" or "0", or can be infinitely variable in value.

The use of ordinals such as first, second and third does not necessarily imply a ranked sense of order, but rather may only distinguish between multiple instances of an act or structure.

While the best modes for carrying out the disclosure have been described in detail, those familiar with the art to which this disclosure relates will recognize various alternative designs and embodiments lying within the scope of the appended claims. It is intended that all matter contained in the above description and/or shown in the accompanying drawings shall be interpreted as illustrative only and not as limiting.

What is claimed is:

1. A monitoring system for a rechargeable energy storage system (RESS) including a plurality of battery cells, the monitoring system comprising:
 a heat transfer plate thermally coupled to the plurality of battery cells;
 a sensor arranged to monitor the heat transfer plate, wherein the sensor arranged to monitor the heat transfer plate comprises an ultrasonic sensor; and wherein the ultrasonic sensor is arranged to monitor a wave attenuation in the heat transfer plate, wherein the wave attenuation correlates to a temperature in the heat transfer plate;
 a controller, in communication with the sensor; and
 the controller including an instruction set, the instruction set being executable to:
  monitor, via the sensor, a parameter of the heat transfer plate,
  detect a thermal runaway event when the parameter of the heat transfer plate exceeds a threshold, and
  communicate the thermal runaway event to a battery controller.

2. The monitoring system of claim 1, wherein the instruction set is executable to detect a thermal runaway event when the wave attenuation exceeds a threshold wave attenuation, wherein the threshold wave attenuation correlates to a temperature that is indicative of an onset of the thermal runaway event.

3. The monitoring system of claim 1, further comprising a fluidic heat transfer system that is thermally coupled to the heat transfer plate; wherein the sensor arranged to monitor the heat transfer plate comprises a temperature sensor arranged to monitor a temperature in the fluidic heat transfer system.

4. The monitoring system of claim 3, wherein the instruction set is executable to detect a thermal runaway event when the temperature in the fluidic heat transfer system exceeds a threshold temperature that correlates to a temperature that is indicative of an onset of the thermal runaway event.

5. The monitoring system of claim 1, further comprising a fluidic heat transfer system that is thermally coupled to the heat transfer plate; wherein the sensor arranged to monitor the heat transfer plate comprises a first temperature sensor and a second temperature sensor that are arranged to monitor a temperature differential in the fluidic heat transfer system.

6. The monitoring system of claim 5, wherein the instruction set is executable to detect a thermal runaway event when the temperature differential in the fluidic heat transfer system exceeds a threshold temperature differential.

7. The monitoring system of claim 1, wherein the sensor arranged to monitor the heat transfer plate comprises a thin wire circuit disposed onto the heat transfer plate;
 wherein the controller is arranged to monitor the thin wire circuit.

8. The monitoring system of claim 7, wherein the instruction set is executable to detect a thermal runaway event when the controller detects an impedance of the thin wire circuit that exceeds a threshold impedance.

9. The monitoring system of claim 7, wherein the instruction set is executable to detect a thermal runaway event when the controller detects occurrence of an open circuit in the thin wire circuit, wherein the open circuit in the thin wire circuit is due to a temperature-induced fracture of the thin wire circuit or a temperature-induced melting of the thin wire circuit.

10. The monitoring system of claim 1, wherein the heat transfer plate thermally coupled to the plurality of battery cells comprises a sheet that is interposed between adjacent ones of the plurality of battery cells and in thermal contact with external side portions of the battery cells.

11. The monitoring system of claim 1, wherein the heat transfer plate comprises a sheet that is interposed between adjacent battery cells and in thermal contact with outer bottom surfaces thereof.

12. A monitoring system for a rechargeable energy storage system (RESS), the monitoring system comprising:
 a plurality of heat transfer plates interposed between adjacent electrochemical battery cells and in thermal contact with external side portions of the electrochemical battery cells;
 at least one sensor arranged to monitor the plurality of heat transfer plates, wherein the sensor arranged to monitor the plurality of heat transfer plates comprises an ultrasonic sensor;
 and wherein the ultrasonic sensor is arranged to monitor a wave attenuation in the heat transfer plate, wherein the wave attenuation correlates to a temperature in the electrochemical battery cells;

a controller, in communication with the at least one sensor; and the controller including an instruction set, the instruction set being executable to:
- monitor, via the at least one sensor, the plurality of heat transfer plates to determine a parameter of the electrochemical battery cells;
- detect a thermal runaway event when the parameter of the electrochemical battery cells exceeds a threshold, and
- communicate the thermal runaway event to a battery controller.

13. The monitoring system of claim 12, further comprising a fluidic heat transfer system that is thermally coupled to the heat transfer plate; wherein the sensor arranged to monitor the heat transfer plate comprises a temperature sensor arranged to monitor a temperature in the fluidic heat transfer system.

14. The monitoring system of claim 12, further comprising a fluidic heat transfer system that is thermally coupled to the heat transfer plate; wherein the sensor arranged to monitor the heat transfer plate comprises a first temperature sensor and a second temperature sensor that are arranged to monitor a temperature differential in the fluidic heat transfer system.

15. The monitoring system of claim 12, wherein the sensor arranged to monitor the electrochemical battery cells comprises a thin wire circuit disposed onto the heat transfer plate, wherein the controller is arranged to monitor the thin wire circuit.

16. The monitoring system of claim 15, wherein the instruction set is executable to detect a thermal runaway event when an impedance of the thin wire circuit exceeds a threshold impedance.

17. The monitoring system of claim 15, wherein the instruction set is executable to detect a thermal runaway event when the controller detects occurrence of an open circuit in the thin wire circuit.

18. The monitoring system of claim 12, wherein the plurality of heat transfer plates interposed between electrochemical battery cells and in thermal contact with external side portions of the electrochemical battery cells comprises a plurality of sheets that is interposed between the adjacent electrochemical battery cells and in thermal contact with the external side portions of the electrochemical battery cells; and wherein the plurality of sheets are fabricated from one of copper, aluminum, steel, or alloys thereof.

19. A monitoring system for a rechargeable energy storage system (RESS) including a plurality of battery cells, the monitoring system comprising:
- a heat transfer plate thermally coupled to the plurality of battery cells;
- a sensor arranged to monitor the heat transfer plate, wherein the sensor arranged to monitor the heat transfer plate comprises an ultrasonic sensor; and wherein the ultrasonic sensor is arranged to monitor a wave attenuation in the heat transfer plate, wherein the wave attenuation correlates to a temperature in the heat transfer plate;
- a controller, in communication with the sensor; and
- the controller including an instruction set, the instruction set being executable to:
  - monitor, via the sensor, a wave attenuation of the heat transfer plate,
  - detect a thermal runaway event when the wave attenuation exceeds a threshold wave attenuation, wherein the threshold wave attenuation correlates to a temperature that is indicative of an onset of the thermal runaway event, and
  - communicate the thermal runaway event to a battery controller.

20. The monitoring system of claim 19, wherein the heat transfer plate thermally coupled to the plurality of battery cells comprises a sheet that is interposed between adjacent ones of the plurality of battery cells and in thermal contact with external side portions of the battery cells.

* * * * *